(12) United States Patent
Steenbrink et al.

(10) Patent No.: US 8,263,942 B2
(45) Date of Patent: *Sep. 11, 2012

(54) SYSTEM, METHOD AND APPARATUS FOR MULTI-BEAM LITHOGRAPHY INCLUDING A DISPENSER CATHODE FOR HOMOGENEOUS ELECTRON EMISSION

(75) Inventors: Stijn Willem Herman Karel Steenbrink, Delft (NL); Pieter Kruit, Delft (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/082,333

(22) Filed: Apr. 7, 2011

(65) Prior Publication Data
US 2011/0180721 A1    Jul. 28, 2011

Related U.S. Application Data

(60) Division of application No. 12/750,619, filed on Mar. 30, 2010, which is a division of application No. 11/650,310, filed on Jan. 5, 2007, now Pat. No. 7,710,009, which is a continuation of application No. 10/778,787, filed on Feb. 13, 2004, now Pat. No. 7,215,070.

(60) Provisional application No. 60/447,975, filed on Feb. 14, 2003.

(51) Int. Cl.
*H01J 19/14* (2006.01)
*H01J 1/20* (2006.01)
*H01J 1/14* (2006.01)

(52) U.S. Cl. .......... 250/423 F; 250/423 R; 250/493.1; 313/270; 313/337; 313/345; 313/346 R; 313/346 DC

(58) Field of Classification Search .......... 250/423 R, 250/423 F, 493.1; 313/270, 337, 345, 346 R, 313/346 DC
See application file for complete search history.

(56) References Cited

U.S. PATENT DOCUMENTS

| | | | |
|---|---|---|---|
| 4,101,800 A | 7/1978 | Thomas et al. | 313/346 DC |
| 4,302,702 A | 11/1981 | Montgaillard et al. | |
| 4,310,603 A | 1/1982 | Falce | 313/346 DC |
| 4,379,979 A | 4/1983 | Thomas et al. | 313/346 R |
| 4,460,831 A | 7/1984 | Oettinger et al. | 313/542 |
| 4,583,023 A | 4/1986 | Friedman et al. | 313/346 R |
| 4,587,455 A | 5/1986 | Falce et al. | 313/346 DC |
| 4,801,994 A * | 1/1989 | Van Gorkom et al. | 313/366 |
| 4,900,285 A | 2/1990 | van Esdonk et al. | 313/346 DC |
| 5,072,148 A * | 12/1991 | Grunwald et al. | 313/346 DC |
| 5,126,574 A * | 6/1992 | Gallagher | 250/492.2 |

(Continued)

FOREIGN PATENT DOCUMENTS
GB     810101     3/1959

*Primary Examiner* — David A Vanore
(74) *Attorney, Agent, or Firm* — Blakely Sokoloff Taylor & Zafman

(57) ABSTRACT

A dispenser cathode which comprises an emission surface, a reservoir for material releasing, when heated, work-function-lowering particles, and at least one passage for allowing diffusion of work-function-lowering particles from said reservoir to said emission surface, said emission surface comprising at least one emission area and at least one non-emission area covered with emission-suppressing material and surrounding each emission area, said non-emission area comprising at least one passage connecting said reservoir with said non-emission area and debouching within a diffusion length distance from an emission area for allowing diffusion of work-function-lowering particles from said reservoir to said emission area.

17 Claims, 9 Drawing Sheets

U.S. PATENT DOCUMENTS

| | | | |
|---|---|---|---|
| 5,831,378 A * | 11/1998 | Rolfson et al. | 313/336 |
| 6,366,011 B1 | 4/2002 | Komiya et al. | 313/346 R |
| 6,798,126 B2 * | 9/2004 | Schwind et al. | 313/309 |
| 7,215,070 B2 * | 5/2007 | Steenbrink et al. | 313/346 DC |
| 7,710,009 B2 * | 5/2010 | Steenbrink et al. | 313/346 DC |
| 7,893,605 B2 * | 2/2011 | Mammana et al. | 313/346 R |
| 8,058,159 B2 * | 11/2011 | Robinson et al. | 438/558 |
| 2006/0028114 A1 * | 2/2006 | Steenbrink et al. | 313/345 |
| 2007/0182303 A1 * | 8/2007 | Steenbrink et al. | 313/346 DC |
| 2010/0219357 A1 * | 9/2010 | Steenbrink et al. | 250/492.3 |

* cited by examiner

SYSTEM, METHOD AND APPARATUS FOR MULTI-BEAM LITHOGRAPHY INCLUDING A DISPENSER CATHODE FOR HOMOGENEOUS ELECTRON EMISSION

CROSS REFERENCE TO RELATED APPLICATION

The present patent application is a Divisional Application claiming the benefit of U.S. patent application Ser. No. 12/750,619, filed Mar. 30, 2010, which is a Divisional Application claiming the benefit of Continuation application Ser. No. 11/650,310, filed Jan. 5, 2007 now U.S. Pat. No. 7,710,009, which claims the benefit of non-provisional U.S. patent application Ser. No. 10/778,787 filed Feb. 13, 2004 now U.S. Pat. No. 7,215,070 B2, issued May 8, 2007, which claims priority from U.S. Provisional Application No. 60/447,975, filed Feb. 14, 2003.

BACKGROUND

1. Field of the Invention

The present invention relates to thermionic cathodes, in particular for use in a lithography system, in particular a multi-beam lithography system.

2. Prior Art

Thermionic cathodes, more specific controlled porosity dispenser-type thermionic cathodes, are well known in the art. These dispenser cathodes are commonly used in for instance televisions, computer monitors and microwave ovens. Such a dispenser cathode usually comprises a cathode body with a reservoir comprising a cavity filled with work function lowering material and with an emission surface, and a heating element for generating the heat needed to cause work function lowering particles to diffuse from the reservoir to an emission area on the emission surface and to create the thermionic emission. In general, the entire emission surface is used as emission area.

There are several types of reservoirs known in the art. In a first type of reservoir, the cavity is filled with a porous matrix and the pores of this matrix are filled with the work-function-lowering particles, e.g. compounds of alkaline earth metals like Ba, Ca and Sr. In these dispenser cathodes, usually one surface of the porous matrix functions as emission surface. Heating the cathode will release work function lowering particles from the porous matrix to the emission surface and will cause thermionic emission.

In a second type of reservoir, work function lowering material is present in a space behind the porous matrix. During operation work function lowering particles, e.g. $B\alpha$ or $B\alpha O$, are generated or released within the pores and are supplied from the space behind the porous matrix and then migrate through the pores of the porous matrix and are supplied to the emission surface in sufficient quantities to maintain good emission surface coverage which assures adequate emission from the emission surface.

In order to increase brightness of these type of cathodes, a coating is deposited on top of the porous matrix, usually on the entire surface of the metal matrix. Thus, the entire emission surface becomes an emission area. The coating usually has several layers, at least one of which comprising a work-function-lowering material. Nowadays the most widely used work-function-lowering material for this coating layer comprises a scandate compound. Appropriate fabrication techniques and components of these scandate dispenser cathodes are for instance disclosed in U.S. Pat. Nos. 4,007,393, 4,350,920, 4,594,220, 5,064,397, 5,261,845, 5,264,757, 5,314,364, 6,407,633 and 6,348,756, which documents are all incorporated by reference as if fully set forth.

In these known cathodes, the connections between the pores are randomly generated. An inherent consequence is that the path length that the active materials must travel to reach the emission surface can be much larger than the thickness of the matrix layer. This limits the lifetime and emission of these conventional dispenser cathodes. Furthermore, these pores debouche in the emission surface, which forms a relatively large emission area in its entirety.

U.S. Pat. No. 4,101,800 discloses a controlled porosity dispenser cathode provided with a thin perforated foil on top of the matrix layer. The foil is made of a refractory metal. The active materials migrate through the holes in the perforated foil to coat the surface of the foil. The foil thus serves as the emission surface of the cathode. In this cathode again, the entire emission surface is emission area A further improvement of this concept is disclosed in U.S. Pat. No. 4,310,603. The dispenser cathode disclosed in this document comprises a cathode body comprising a reservoir with work function lowering material and a heating element located in the cathode body on one side of the reservoir. The opposite side of the reservoir defines an emission side surface. The emission side surface of the reservoir is provided with a foil with holes covering the reservoir, welded to the cathode body and preferably made of tungsten or molybdenum. Parts of the foil are provided with a coating comprising work function lowering material defining emission areas, and parts of the foil are provided with non-emitting material defining a shadow grid. The work function lowering coating establishes a lower work function $\phi$ and thus an enhanced emissivity of the emission areas. In this cathode, all the holes are located in the large emission areas.

In these controlled-porosity dispenser cathodes described above, the dimensions of the pitch between the holes define the path length of the active materials. However, the holes in the emission surface also induce a severe inhomogenity in the radiation from the cathode. Furthermore, almost the entire emission surface acts as emission area.

The invention further relates to the use of a dispenser-type cathode in electron beam exposure apparatus like lithography systems, electron microscopes, inspection systems. In these electron beam apparatus generally a $L\alpha B_6$-source, a field emitter or a Schotky type emitter is used. Most of these apparatus require a relatively low current is required, as these apparatus require a homogeneous electron source with a relatively small dimension. The use of a dispenser cathode with a high brightness in an electron beam apparatus is therefore not trivial. The diameter of a prior-art dispenser cathode, for instance, is 100-10,000 times larger than the diameter of a $L\alpha B_6$-source or field emitter source. Thus, the emission current is too high for the electron beam apparatus. Furthermore, since more electrons are emitted in the same period of time. Coulomb interactions reduce the resolution of an apparatus when using the known dispenser cathodes.

This problem is especially relevant in single source multi-electron beam systems. In an attempt to overcome this problem, especially in single source multi-electron beam systems, a diverging electron beam with a limited emission area is used. Examples of such systems are disclosed in for example U.S. Pat. Nos. 5,834,783, 5,905,257 and 5,981,954 by Canon and U.S. provisional application 60/422,758 by the present applicant, which is incorporated by reference as if fully set forth. A so-called triode setup is most often used to accomplish the diverging electron beam. The electric field lines produced by two electrodes, oppositely charged and in close proximity of the emissive cathode surface, create an expanding electron beam using only a fraction of the emitted electrons. However, before the electrons diverge, their individual trajectories first converge and go through a crossover. This results in stronger Coulomb interactions and consequently in an increase of the energy spread. This extraction approach thus poses a problem, especially in high-resolution systems, like electron beam lithography systems.

SUMMARY OF THE INVENTION

It is an object of the present invention to provide an electron source and lithography system improved thereby, which provides a homogeneous electron beam, homogeneous both in time and in space, in particular realising an electric field providing a lens effect, more in particular for resulting into a narrower beam than without such E-field.

It is furthermore an object of the present invention to provide an electron source with a relatively small emission area.

It furthermore is an object of the present invention to provide an electron source with a narrow energy distribution.

The present invention to that end provides a dispenser cathode which comprises:

an emission surface comprising at least one emission area for emitting electrons and at least one non-emission area covered with emission-suppressing material and surrounding each emission area;

a reservoir for material releasing, when heated, work-function-lowering particles, and at least one passage connecting said reservoir and said emission surface for allowing diffusion of work-function-lowering particles from said reservoir to said emission surface, said at least one passage debauching in said non-emission area and within a diffusion length distance from an emission area for allowing diffusion of work-function-lowering particles from said reservoir to said emission area.

By applying the emission area having clear boundaries, and passages debouching outside the emission area, it has proven possible to obtain a dispenser cathode which in both spatially homogeneous as well as suitable for application in high-resolution electron beam systems.

In an embodiment, the emission area comprises a blocking layer for blocking work-function-lowering particles. This blocking layer prevents work function lowering particles not coming through a passage from reaching the emission area. In this way, the emission area is not disrupted and remains homogenous. This in turn results in a spatially homogeneous electron beam.

In a further embodiment, the dispenser cathode comprises a membrane covering the emission side of said reservoir, said membrane being substantially impermeable to work-function lowering particles. In this way a well-defined emission area and a well defined non-emission area can be created.

In another embodiment, the membrane has an emission side surface and a cathode side surface (i.e., the side directed towards the reservoir), said emission side surface having at least one emission area and at least one non-emission area surrounding said at least one emission area, wherein said emission area is coated with work-function-lowering material and said non-emission area is coated with emission-suppressing material.

In an embodiment of the dispenser cathode with the membrane, the membrane is a metal membrane covering the emission surface side of said reservoir and is provided with perforations in said non-emission area providing passages for said work function lowering particles.

In an embodiment, the passages debouch next to said emission area. Preferably, in this embodiment, the passages debouche adjacent the emission area. This makes it easy for the work function lowering particles to reach the emission area, and makes the diffusion easily controllable.

In an embodiment of the dispenser cathode of the present invention, the dispenser cathode comprises a plurality of passages, all passages debouching in said non-emission area.

In another embodiment of the dispenser cathode of the present invention, the emission surface has at least one convex surface. This helps producing a diverging beam. In a further embodiment, the emission surface is convex at the location of an emission area. When the dispenser cathode is used in high-resolution electron beam systems, it is preferred to use a diverging electron beam, in order to avoid cross-overs in the electron beam, which causes a broadening of the energy distribution function in the electron beam.

In another embodiment of the dispenser cathode of the present invention, it is furthermore provided with a support structure for supporting said emission area. In this way, the emission area remains well defined during operation. In an embodiment, the support structure comprises a pillar at the location of the emission area, reaching through said reservoir. The pillar provides an easy way of providing a well-defined emission area.

In a further embodiment thereof, the pillar has a top, the top forming part of said emission surface. In a further embodiment, the top of said pillar forms an emission area.

In still a further embodiment of the dispenser cathode with the pillar, a passage runs along a side of said pillar. In this embodiment, an easy way of making this is by providing a free-standing or substantially free-standing pillar in the reservoir. In this way, the sidewall of the pillar provides a wall of a passage. This way, the pillar has two functions: the first function is defining the emission area. Its second function is defining a boundary to a passage for the work function lowering particles.

Another aspect of the invention concerns a dispenser cathode which comprises:

a reservoir for material releasing, when heated, work function lowering particles;

an emission surface comprising at least one emission area for emitting electrons, comprising a blocking layer for blocking work function lowering particles, and at least one non-emission area covered with emission-suppressing material and surrounding each emission area, and at least one passage connecting said reservoir and said emission surface for allowing diffusion of work-function-lowering particles from said reservoir to said emission surface.

The blocking layer prevents work function lowering particles from reaching the emission area via other paths then the ones defined by a passage. In this way, the emission area remains well defined during operation.

In an embodiment of this dispenser cathode, the at least one passage debouches (or discharges, flows out) in said non-emission area and within a diffusion length distance from an emission area for allowing diffusion of work-function-lowering particles from said reservoir to said emission area.

In another embodiment, the dispenser cathode of the present invention further comprises an extractor electrode provided above the emission area, the extractor electrode provided to provide, in operation, an electrostatic field functioning as a negative lens to emitted electrons.

In an embodiment of the dispenser cathode described above, it further comprises a wall, substantially surrounding the emission surface. This wall is added to increase uniformity of the electron beam. In an embodiment, this wall surrounds both the emission surface and said passage or passages which are within a diffusion length distance from said emission area. In an embodiment, said wall runs from said emission area at about 20-25 degrees, preferably at about the Pierce angle. An advantage of this wall, in particular at the specific angles, is an improvement in emission uniformity due to a more uniform E-field. In fact, the emission area merges into the wall as continuously as possible, in order to create a smooth E-field. In this wall, in an embodiment at a location where the wall goes over in the emission area, one or more passages of channels are provided.

In an embodiment of the dispenser cathode, the emission surface is situated below the level of the surface of the dispenser cathode in a recess in said surface. In an embodiment thereof, the wall of said recess is at about 20-25 degrees, preferably at about the Pierce angle, with respect to the emission surface.

In an embodiment of the invention, the dispenser cathode further comprises at least one heater for heating said emission area.

In another or in such an embodiment, the dispenser further comprises at least one heater for heating said work-function-lowering particles.

The invention further relates to a cathode comprising an emission area for emitting electrons, said emission area merging into a wall surrounding said emission area, said wall being electrically conductive. In an embodiment, said wall is covered with an emission-suppressing, electrically conducting material. In a further embodiment, the wall is an electric conductor, or is covered with an electric conductor.

In an embodiment of this cathode, said wall substantially runs at an angle of about 20-25 degrees with respect to the emission area.

In a further embodiment thereof, said cathode further comprises at least one reservoir comprising work-function-lowering particles, and at least one passage or channel having an inlet for allowing work-function-lowering particles in said reservoir to enter said passage, and an outlet in said wall at a diffusion length distance of said emission area.

The invention further relates to an electron source for generating a plurality of electron beams, comprising a plurality of the dispenser cathodes or cathodes as described above.

The invention further relates to a lithography system comprising a dispenser cathode of the current invention.

In an embodiment the lithography system further comprises beam splitter means for splitting the electron beam generated by the dispense cathode up into a plurality of electron beamlets, modulator means for individually modulating substantially each electron beamlet, and control means for controlling said modulator means for modulating the beamlets according to a predetermined pattern.

BRIEF DESCRIPTION OF THE DRAWINGS

The invention will now be explained with reference to the following drawings which are only intended to illustrate preferred embodiments of the invention and not to limit its scope of protection.

DESCRIPTION OF PREFERRED EMBODIMENTS

In the figures, entities with the same reference numbers relate to the same or corresponding features.

Figure 1:
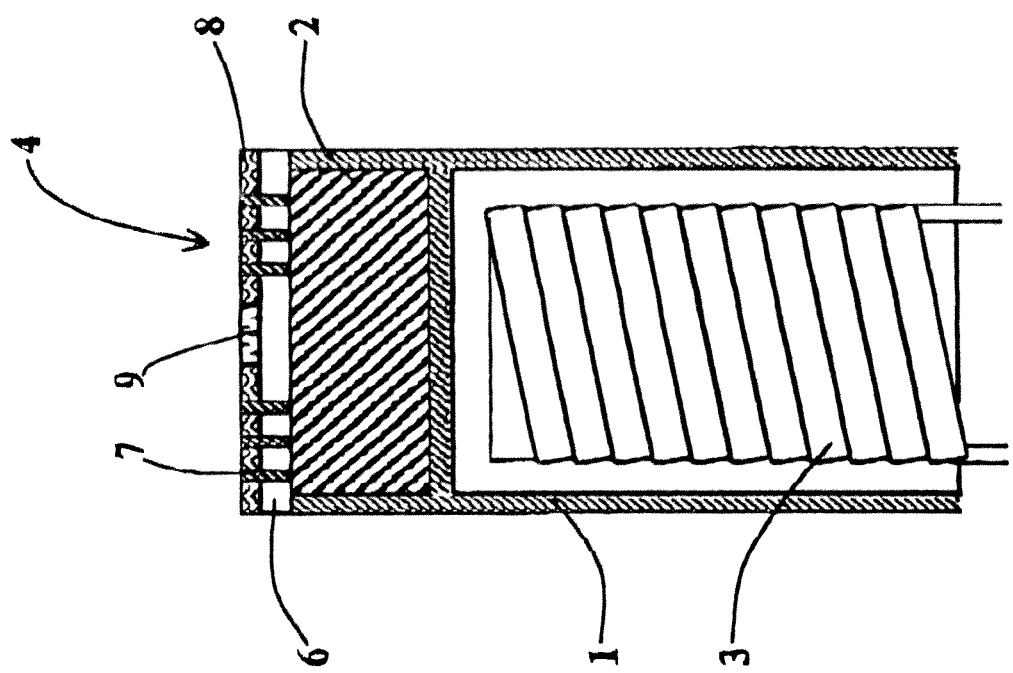
FIG. 1 shows a cross section of a cathode of the current invention.
Figure 2:
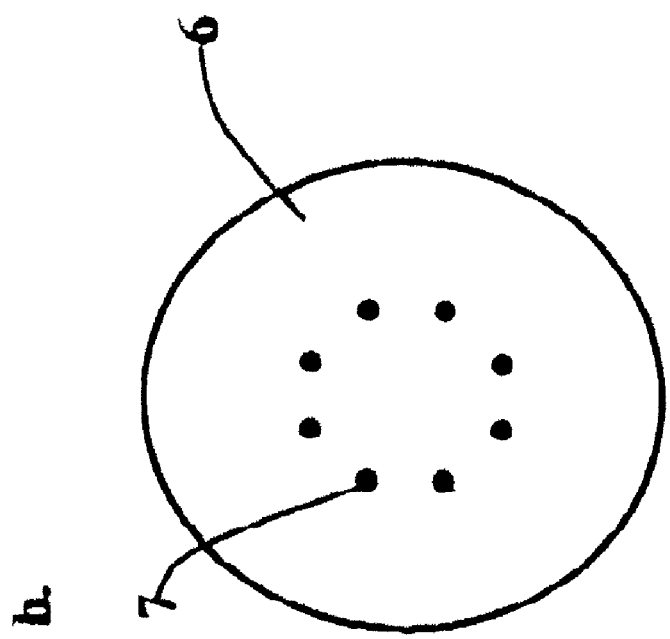
FIGS. 2a, 2b shows top views of the cathode of FIG. 1, of the emission surface indicating different aspects of the current invention.
Figure 2:
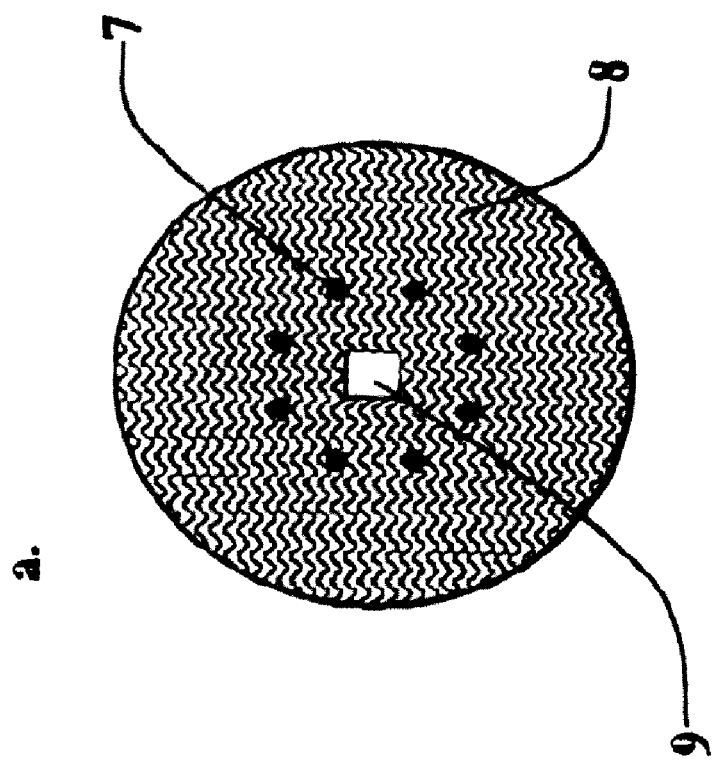

FIG. 1 shows a first embodiment of a dispenser cathode of the present invention. The dispenser cathode has a cathode body 1, the tipper part of which forming a reservoir filled with compounds 2 that dispense, when heated by a heating element 3, at least one kind of work-function-lowering particles towards the emission side surface 4 of the reservoir 2. The emission side surface 4 of the reservoir 1 is divided into two types of areas as shown in FIGS. 2a and 2b, showing a top view of the dispenser cathode of FIG. 1.

The first type of area of the emission side surface 4 is the emission area 9 which is responsible for the emission of electrons. The emission area is usually coated with work function lowering material, like iridium, osmium or other platinum-group metals, or scandate. These materials or compositions are known to a man skilled in the art.

The second type of area of the emission surface 4 is the non-emission area 8 which surrounds each emission area 9. The non-emission area is coated with emission suppressing material, like zirconium or graphite.

The non-emission areas surrounding each emission area are provided to limit the area of the emission areas. In this way, it is possible to provide a cathode having sources having a limited size. In practical applications the emission areas will be about 100 micron×100 micron in size or less.

The dispenser cathode is provided with a membrane 6, preferably a metal membrane, on the emission side surface of the reservoir 1. This membrane ensures the homogenity of the electron emission. There is no direct connection between both sides of the membrane 6 in the emission area 9. At the location of the emission area 9, the membrane is substantially impermeable to work-function-lowering particles from the reservoir. This can for instance be accomplished by making the membrane of a metal which is substantially impermeable to the work function lowering material. Another embodiment provides the membrane with a substantially impermeable layer at the location of the emission area.

The membrane 6 has one or more passages 7, preferably holes, through the membrane 6, connecting reservoir 1 and the emission surface side 4 of the membrane 6. The passages 7 allow work-function-lowering particles from the reservoir to diffuse from the reservoir 1 to the emission area 9, to enhance the emission of electrons.

On the emission side, the membrane 6 is provided with a layer of work function lowering material 9 defining the emission area, and a layer of emission-suppressing material 8, defining the non-emission area.

A top view of this configuration is depicted in FIG. 2a. Additionally, choosing the right distance between at least one passage 7 and any position residing in the emission area 9 ensures the continuous supply of work-function-lowering material 2. This distance should be smaller than the largest diffusion length of the work-function-lowering particles coming form the reservoir 2. A further enhancement of the emission is established by coating the first area with at least one layer 9 of work-function-lowering material.

FIG. 2b shows a top view of membrane 6. The membrane 6 has through holes at a diffusion length distance from the emission area, and is preferably a metal membrane. Suitable metals include refractory metals like tungsten and molybdenum. Work function lowering particles diffusing from the reservoir towards the emission surface can only pass the membrane via the holes 7.

Using the heater, the work function lowering particles are released from the reservoir. These particles diffuse through the holes in the membrane to the emission area. At the emission area, electrons are released. Using an extraction electrode, the electrons are accelerated.

Figure 3:
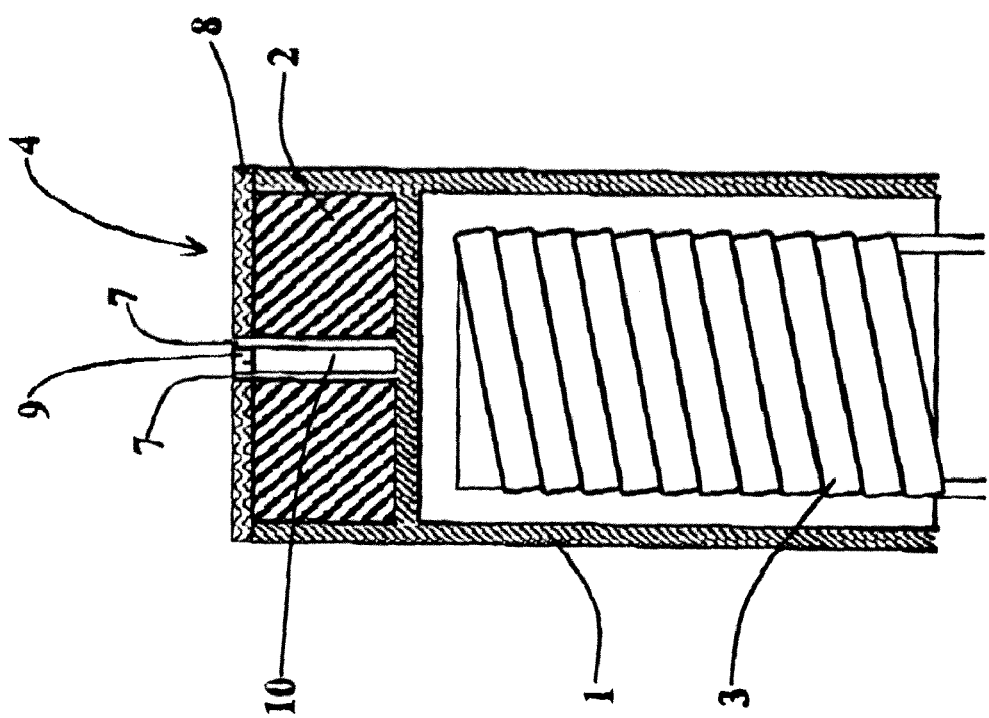
FIG. 3 shows a cross section of a cathode of the current invention with a support structure supporting the emission area.

FIG. 3 shows a second embodiment of the present invention. Again the dispenser cathode comprises a cathode body 1, the upper part of which forms a reservoir 2, and a heating element 3. The emission surface 4 of the dispenser cathode comprises an emission area 9 and a non emission area 8 with the same working principle as the dispenser cathode in the first embodiment of the present invention, i.e. electrons are emitted from the emission area 9, while work-function-lowering particles are supplied to the emission area 9 via the non-emission area 8 surrounding the emission area 9. In this particular embodiment, however, instead of a membrane 6, the non porosity of the emission area for work function lowering particles is established by a support structure 10 directly underneath the emission surface 4. The support structure 10 is preferably pillar-shaped, and extends through the reservoir. In this embodiment, the passages debouch adjacent to the emission area.

Figure 4:
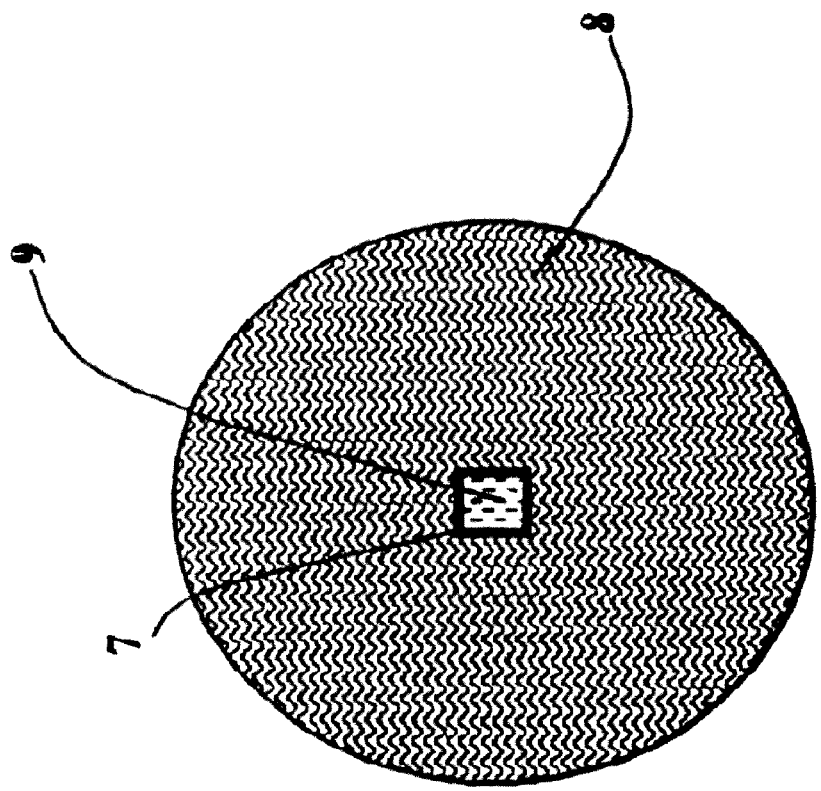
FIG. 4 shows a top view of the cathode of FIG. 3.

In this embodiment the reservoir 2 is filled with a porous material containing the work function lowering material in its pores. This enhances the dispension of work-function lowering particles towards the surface. The non-emission area 8 is coated with at least one layer 8 of emission suppressing material, herewith dramatically reducing the electron emission from this area. To enhance the electron emission even further, a coating layer 9 of work-function-lowering material is provided on top of the emission pillar 10. A top view of this embodiment is depicted in FIG. 4.

The pillar 10 is a substantially free standing structure, thus providing a passage around the pillar. In the top view of FIG. 4 it can clearly be seen that the passage 7 surrounds the entire pillar 10 and thus the entire emission area 9.

The support structure 10 preferably comprises a metal. Potential candidates are refractory metals like molybdenum and tungsten.

Figure 5:
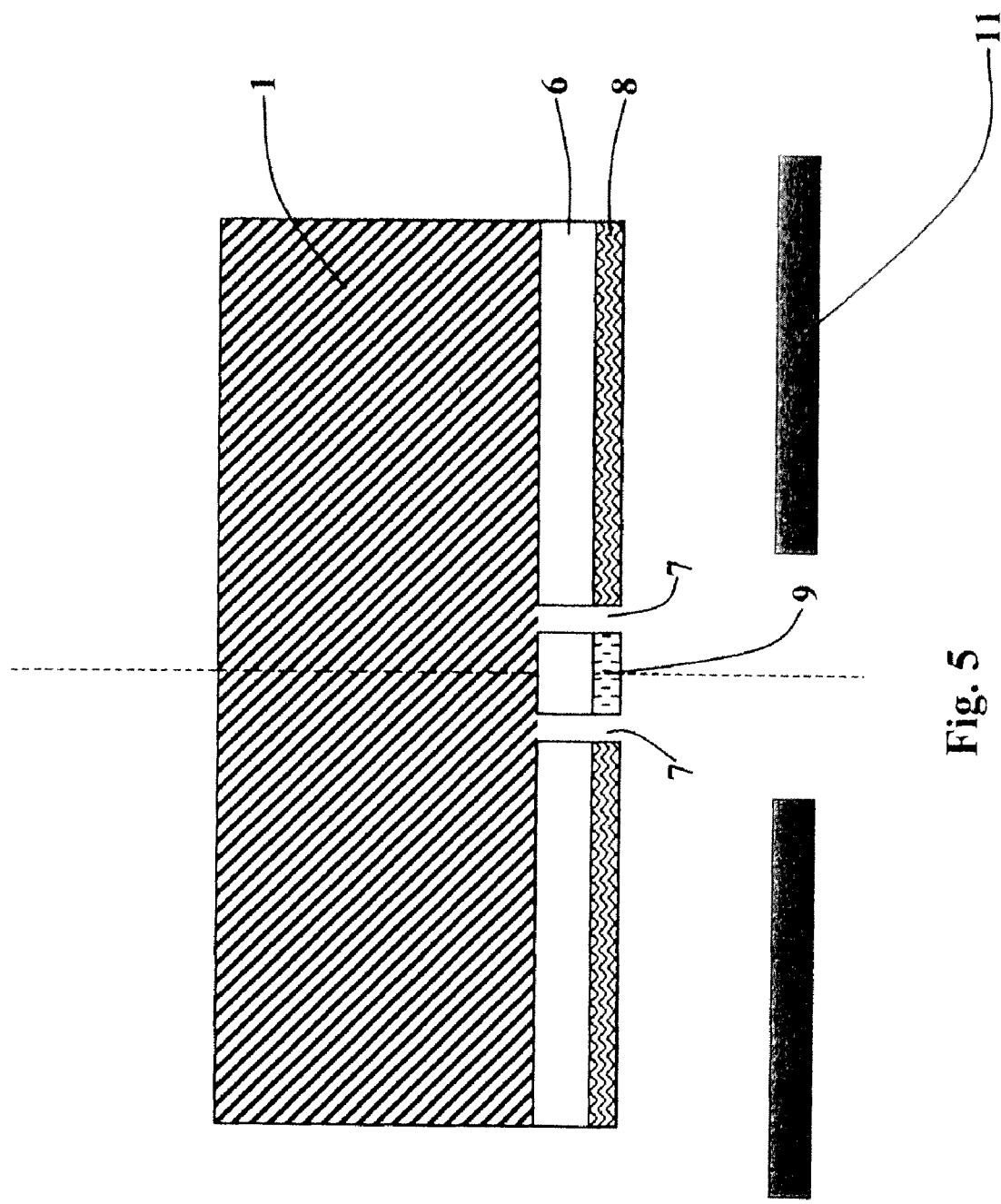
FIG. 5 shows a cross section of the emission part of a cathode of the current invention with a porous metal reservoir.

FIG. 5 shows an embodiment of the dispenser cathode of the present invention, showing porous material containing the work function lowering material 1. In this embodiment, porous tungsten is used for containing the work function lowering material. At the emission side of the reservoir, a membrane 6 is provided having holes or perforations 7. The membrane comprises a non-emission area coated with emission suppressing material 8, and an emission area 9 coated with work function lowering material. In this embodiment, the holes 7 forming the passages for work function lowering particles, are provided directly adjacent the emission area. Furthermore, the extractor electrode 11 is shown located close to the emission surface, thus providing a source radiating a diverging beam of electrons. The entire area shown is about 1 mm wide, while the emission area 9 is about 40 µm wide.

Figure 6:
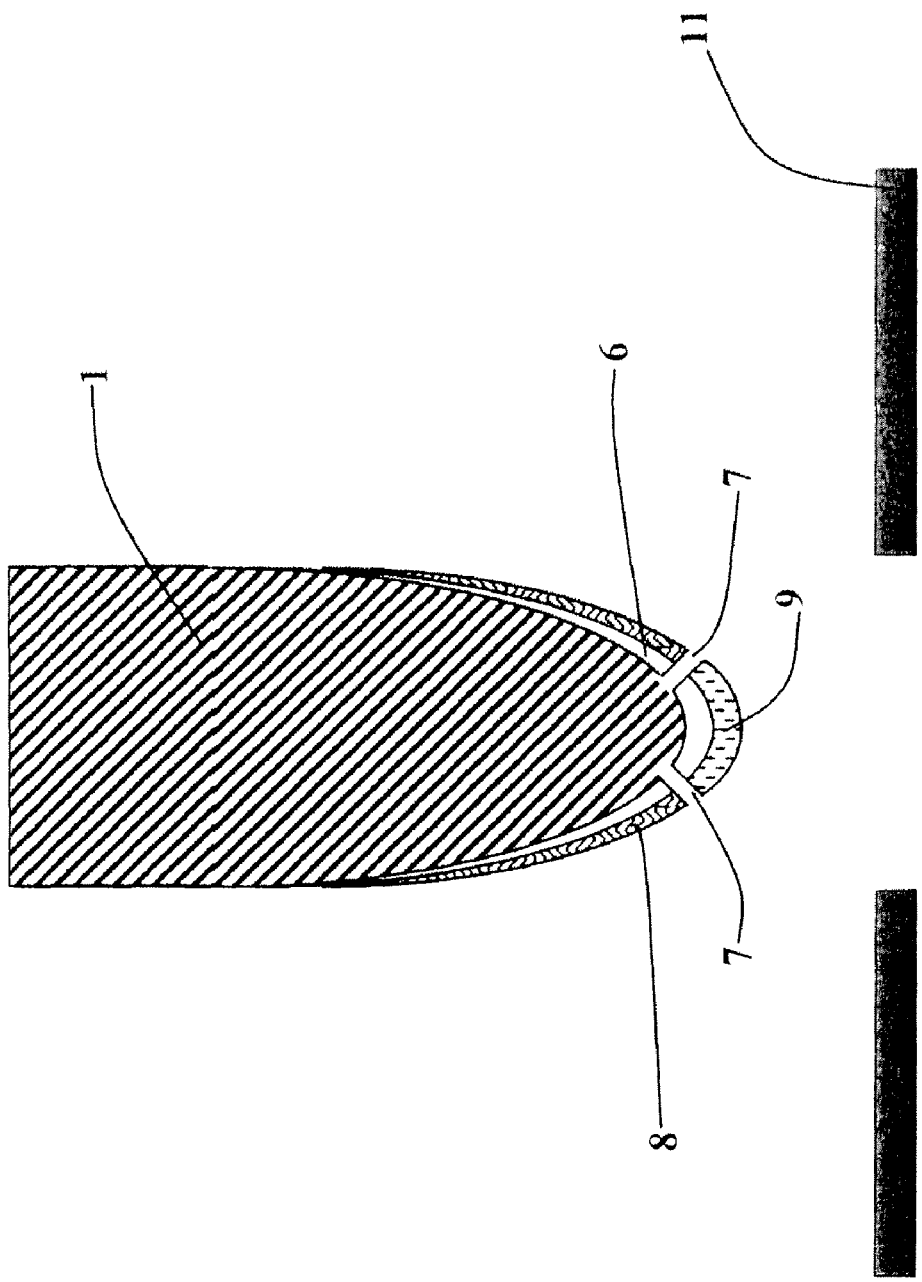
FIG. 6 shows a cross section view of another embodiment of a cathode of the present invention.

FIG. 6 shows another embodiment of the dispenser cathode of the current invention. In this embodiment, the emission surface is a curved surface which is convex. The reservoir comprises porous tungsten with work function lowering material 1 in its pores. The porous tungsten is provided with a tungsten membrane 6 which is substantially impermeable to work function lowering particles. The membrane is provided with holes 7 providing passages for the work function lowering particles. Again, the emission area 9 is coated with a work function lowering material, e.g. a scandate composition. The remaining area 8 of membrane 6 is coated with emission suppressing material. Using the convex surface, the dispenser cathode emits an almost perfectly diverging beam of electrons having one virtual origin.

Figure 7:
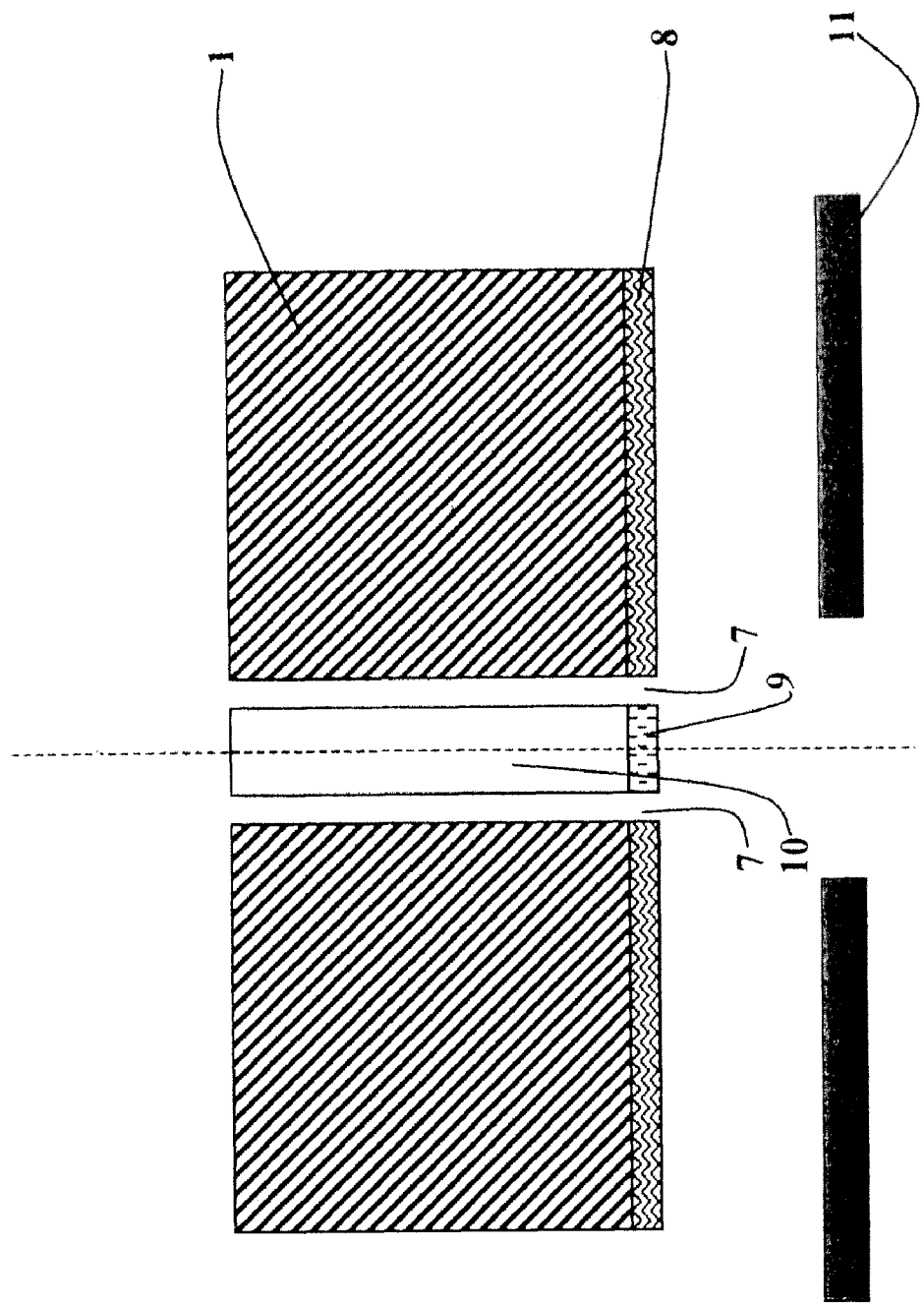
FIG. 7 shows a cross section of a cathode with a convex emission surface.

FIG. 7 shows an embodiment of a dispenser cathode according to the present invention having a free-standing tungsten pillar 10 in a reservoir filled with porous tungsten provided with work function lowering material in its pores 1. As the pillar 10 is free-standing, work function lowering particles can pass along the sides 7 of the pillar 10, which thus provides a passage 7 for allowing the particles to diffuse to the emission area 9.

Figure 8:
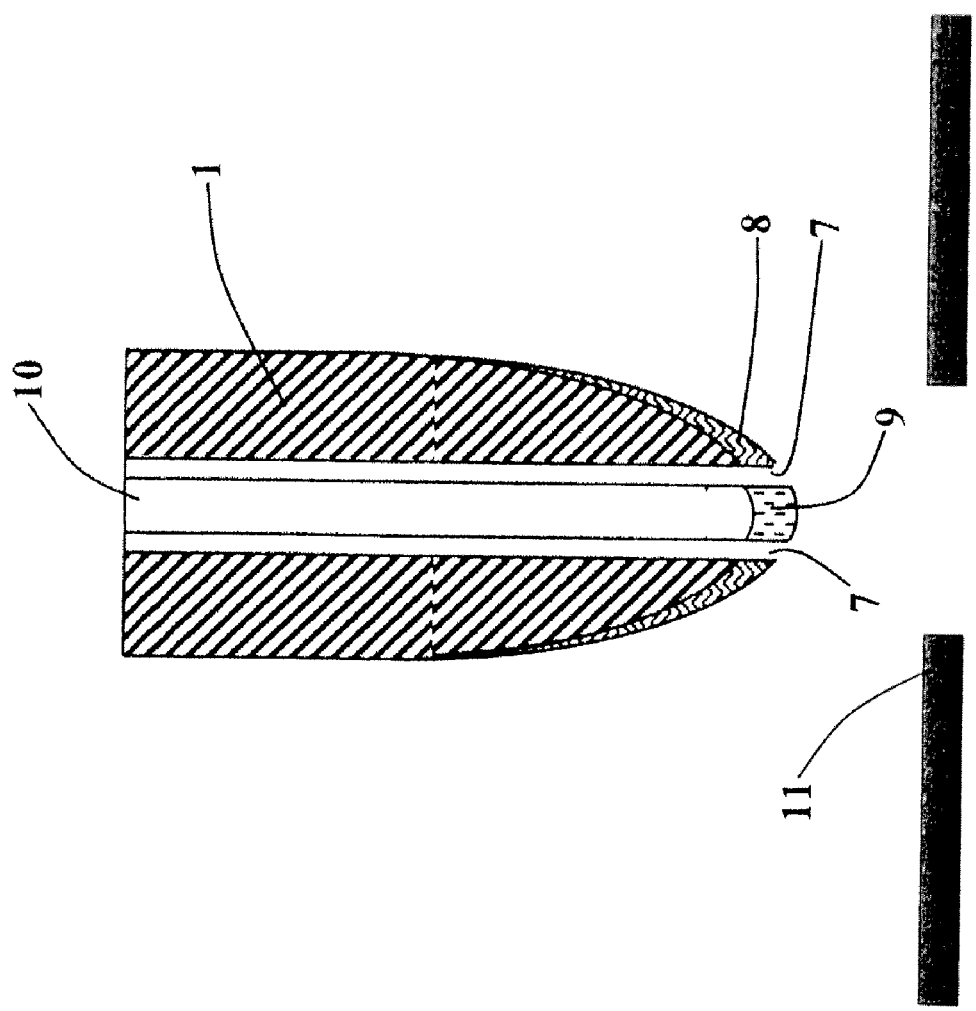
FIG. 8 shows a cross section of another embodiment of a cathode with a curved emission surface.

FIG. 8 shows another embodiment of a dispenser cathode according to the present invention. In this embodiment, a cone-shaped cathode is provided with a free-standing tungsten pillar 10. Around this free-standing pillar, the reservoir is provided with porous tungsten 1. Again, the pores contain the work function lowering material which is released using the heater which is not shown. Because of the cone shape, providing a convex surface, and because of the small size of the emission area 9, this source provides a diverging electron beam. The pillar 10 preferably has a circle cylinder shape. The emission area side top 9 is coated with work function lowering material, for instance a scandate composition. The remaining area 8 is coated with emission suppressing material.

Figure 9:
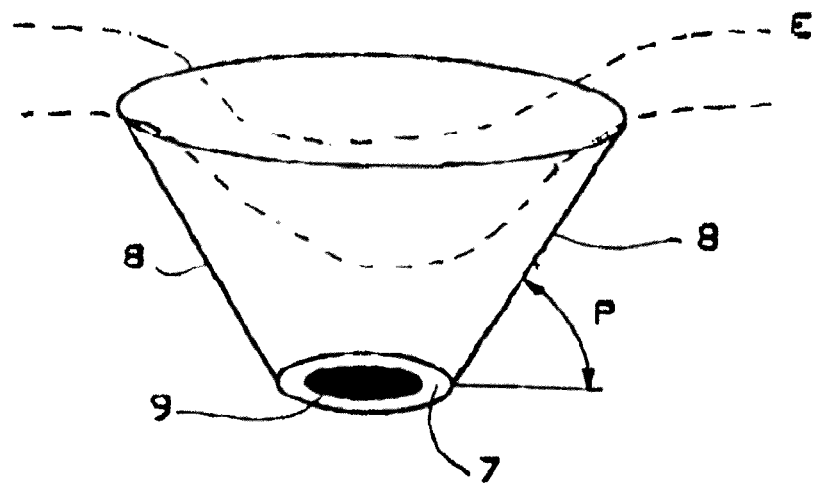
FIG. 9 shows an embodiment of a cathode of the present invention with surrounding walls in a Pierce angle P.

FIG. 9 shows an embodiment of the cathode of the current Invention, having an emission area 9, coated with work function lowering material and surrounded by a passage 7 for allowing further work-function-lowering material to reach the emission area 9. In this specific embodiment, the cathode has a concave or cone-shaped wall 8 surrounding the emission area and which is coated with, or made of, emission suppressing material described above. Preferably, the wall is coated or made of conducting material. In this way, an electric E-field runs as shown in FIG. 9, providing a lens effect which results in a narrower beam.

The angle P of the wall preferably equals the Pierce angle. In most cases, the angle P will be between 20-25 degrees, more preferably 22-23 degrees. In a preferred embodiment, angle P is about 22.5 degrees.

Figure 10:
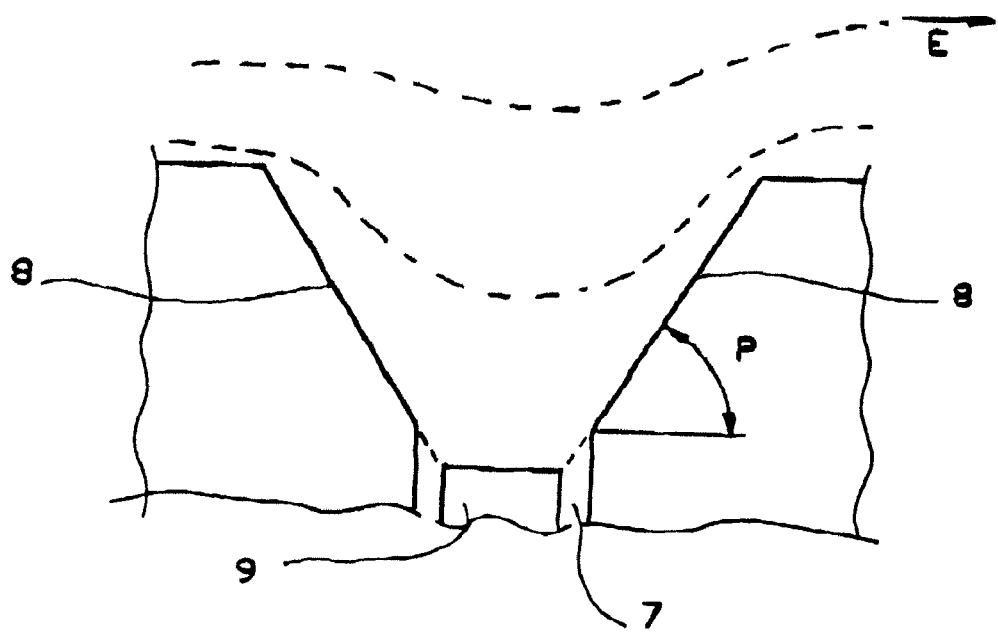
FIG. 10 shows another embodiment of a cathode of FIG. 9 with a pillar.

FIG. 10 shows another embodiment of the cathode, where the emission area, here on a pillar 9, is below the general surface 12 of the cathode. The emission area is surrounded by a cone shaped wall at about a Pierce angle P with respect to the emission area 9. Again, an applied E-field will run as depicted, resulting in a lens effect. Preferably, the wall has an electrically conducting surface and is emission suppressing.

The wall 8 in this embodiment merges into the emission area almost continuously. The passage or channel for the work-function-lowering particles preferably interfere as little as possible with the E-field (electric field). In fact, in a contemplated embodiment, the emission area smoothly merges into the wall. In this wall, where the emission area goes over or emerges into the wall, some small holes are made all the way to a reservoir with the work-function-lowering particles.

A plurality of the cathodes described above may be combined, resulting in a multi-beam cathode.

It is to be understood that the above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the present invention.

The invention claimed is:

1. An electron emitting dispenser cathode which comprises:
    an emission surface comprising at least one emission area for emitting electrons;
    a reservoir for material releasing, when heated, work function lowering particles;
    a support structure for supporting said emission area, said support structure comprising a pillar;
    a plurality of passages (7) connecting said reservoir and said emission surface for allowing diffusion of work function-lowering particles from said reservoir to said at least one emission area, said passages being provided directly adjacent to said at least one emission area, and said pillar defining a boundary to a passage (7) for work function lowering particles adjacent said emission area.

2. The cathode according to claim 1, wherein the cathode comprises a cathode membrane which is provided as a metal membrane.

3. The cathode according to claim 2, wherein the metal includes a refractory metal, wherein the metal preferably is tungsten.

4. The cathode according to claim 1, wherein the emission area is coated with work function lowering materials.

5. The cathode according to claim 1, wherein said passages debouch next to said emission area.

6. The cathode according to claim 1, wherein said emission surface has at least one convex surface, preferably wherein said emission surface is convex at the location of an emission area.

7. The cathode according to claim 1, wherein the pillar has a top forming part of said emission surface, preferably wherein the top of said pillar forms an emission area.

8. The cathode according to claim 1, wherein a passage runs along a side of said pillar.

9. The cathode according to claim 1, wherein the support structure is substantially non-porous for work-function lowering particles.

10. An electron source for generating a plurality of electron beams, comprising a plurality of dispenser cathodes according to claim 1.

11. A lithography system comprising a dispenser cathode according to claim 1.

12. The lithography system of claim 11, further comprising
    beam splitter means for splitting the electron beam generated by the dispenser cathode up into a plurality of electron beamlets,
    modulator means for individually modulating substantially each electron beamlet, and
    control means for controlling said modulator means and for modulating the beamlets according to a predetermined pattern.

13. The lithography system of claim 12, with a single source, multi electron beam system, comprising only one dispenser cathode.

14. A semiconductor wafer, processed using a lithography system according to claim 11.

15. A method for processing a semiconductor wafer, using a lithography system according to claim 11.

16. The cathode according to claim 1, wherein said cathode comprises an extractor electrode provided above the emission area, preferably wherein said extractor electrode, in operation, providing an electrostatic field functioning as a negative lens to emitted electrons.

17. The cathode according to claim 1 or 16, wherein the cathode is arranged for emitting a diverging electron beam.

* * * * *